(12) United States Patent
Berdichevsky et al.

(10) Patent No.: US 7,683,575 B2
(45) Date of Patent: Mar. 23, 2010

(54) METHOD AND APPARATUS FOR IDENTIFYING AND DISCONNECTING SHORT-CIRCUITED BATTERY CELLS WITHIN A BATTERY PACK

(75) Inventors: Eugene Michael Berdichevsky, Palo Alto, CA (US); Kurt Russell Kelty, Palo Alto, CA (US); Scott Ira Kohn, Menlo Park, CA (US)

(73) Assignee: Tesla Motors, Inc., San Carlos, CA (US)

( * ) Notice: Subject to any disclaimer, the term of this patent is extended or adjusted under 35 U.S.C. 154(b) by 314 days.

(21) Appl. No.: 11/779,620

(22) Filed: Jul. 18, 2007

(65) Prior Publication Data

US 2009/0023053 A1 Jan. 22, 2009

(51) Int. Cl.
*H02J 7/00* (2006.01)
(52) U.S. Cl. .................. 320/122; 320/132; 320/133; 320/127
(58) Field of Classification Search .......... 320/132, 320/133, 122, 127
See application file for complete search history.

(56) References Cited

U.S. PATENT DOCUMENTS

| | | | | |
|---|---|---|---|---|
| 5,227,259 | A * | 7/1993 | Weaver et al. ............ | 429/49 |
| 5,521,024 | A | 5/1996 | Sasaki et al. | |
| 5,744,936 | A * | 4/1998 | Kawakami ............... | 320/120 |
| 5,894,212 | A * | 4/1999 | Balogh .................... | 320/122 |
| 5,945,805 | A * | 8/1999 | Takei et al. .............. | 320/124 |
| 6,025,696 | A | 2/2000 | Lenhart et al. | |
| 6,051,955 | A * | 4/2000 | Saeki et al. .............. | 320/121 |
| 6,255,803 | B1 * | 7/2001 | Ishihara et al. ........... | 320/134 |
| 6,265,846 | B1 | 7/2001 | Flechsig et al. | |
| 6,420,852 | B1 * | 7/2002 | Sato ........................ | 320/134 |
| 6,812,670 | B2 * | 11/2004 | Minamiura et al. ....... | 320/116 |
| 7,081,737 | B2 * | 7/2006 | Liu et al. ................. | 320/130 |
| 2006/0186859 | A1 * | 8/2006 | Fujikawa et al. ......... | 320/134 |
| 2006/0192529 | A1 * | 8/2006 | Kimura et al. ........... | 320/116 |

* cited by examiner

*Primary Examiner*—Edward Tso
*Assistant Examiner*—Manuel Hernandez
(74) *Attorney, Agent, or Firm*—Patent Law Office of David G. Beck

(57) ABSTRACT

A method and apparatus for deactivating a bad battery cell from a battery pack for an energy storage system of an electric vehicle is disclosed. The apparatus and methodology includes a clamshell member arranged at an end of the cells and a printed circuit board arranged adjacent to the clamshell member. A collector plate is arranged adjacent to the printed circuit board and a switch is arranged on the printed circuit board. A wire bond is arranged between the switch and one of the cells and a second wire bond is arranged between the switch and the collector plate. The plurality of switches will allow for the identification of the one individual cell having a weak short circuit within the battery pack. Upon identification of the cell with the weak short circuit that cell will have its switch placed in an open position thus electrically isolating the faulty or bad cell from the battery pack.

12 Claims, 2 Drawing Sheets

METHOD AND APPARATUS FOR IDENTIFYING AND DISCONNECTING SHORT-CIRCUITED BATTERY CELLS WITHIN A BATTERY PACK

BACKGROUND OF THE INVENTION

1. Field of the Invention

The subject invention generally relates to cells in a battery pack, and more particularly relates to a method of deactivating faulty or bad battery cells from a battery pack for use in an electric vehicle or other industrial equipment.

2. Description of Related Art

Battery packs have been used for numerous years in electric vehicles, such as automobiles, boat, aerospace vehicles, and within other industrial equipment applications. Many of the electrical systems used in these prior art vehicles and equipment are designed to minimize the possibility of short circuiting and to reduce the potential of a voltage exposure to emergency responders and other people in the general public. Such precautions may help to reduce the possibility of an electrocution or other injury due to high voltage encounters and situations. There have been many different attempts at providing an electrical system that will disconnect electrical circuits due to a crash of a vehicle, high temperature situations or other short circuit that may occur in a vehicle or industrial equipment. Many of these prior art systems would disconnect the battery from the circuit thus creating an open circuit and protecting any responders and other people from dangerous high voltage situations. Generally, these prior art systems disconnect the battery pack when a predetermined force is applied to the vehicle or equipment or when a predetermined thermal event occurs within the circuitry of the battery and or electrical system.

One of the prior art methodologies for disconnecting battery cells would use a conductor wire that is either welded or bonded to a battery cell and is capable of being broke if a mechanical force is applied thereto. In the prior art, one problem with these prior art systems is that the mechanical strength of the breakable conductors may be excessive and not allow for the conductor to break unless it is subject to extreme forces or situations with relation to the vehicle or equipment. Therefore, the disconnecting of the power from the supply of the electric vehicle may not occur during all emergency situations as originally designed and would not occur for short circuits that may effect the storage capacity of the battery cells and the longevity and durability of the battery cells for holding a charge. Furthermore, many of the prior art methodologies of wire bonding conductors to cells did not provide a consistent connection. Current mechanisms such as high thermal events may not break the conductor thus leaving the equipment connected to the circuits power which may result in electrocution and injury to first responders at an accident scene. Some of these prior art methodologies may also have tried insulation displacement conductors to connect a battery cell to a bus bar or connector plate, mechanical crimping or pressure crimping may also have been used to connect battery cells to a bus bar. Furthermore many of these prior art systems would only disconnect during a vehicle accident or hard short circuit but would not disconnect battery cells suffering from internal weak shorts or problematic weak shorts during charging or use within a battery pack environment.

Therefore, there is a need in the art for an improved methodology of deactivating a faulty or bad battery cell from a battery pack in an electrical vehicle or industrial equipment. Furthermore, there is a need in the art for a methodology that will be capable of detecting which individual cell has a weak short circuit, problematic weak short circuit and thus isolate or remove the bad cell from the electrical circuit. Also there is a need in the art for a low cost manufacture methodology and apparatus for deactivating faulty or bad cells from a battery pack in an electric vehicle.

SUMMARY OF THE INVENTION

One object of the present invention may be to provide an improved method of deactivating bad battery cells from a battery pack.

Another object of the present inventions may be to provide a method of deactivating bad battery cells from a battery pack for use in an electric vehicle or industrial equipment.

Another object of the present invention may be to provide an intelligent architecture capable of finding and disconnecting any cell with a weak short within a battery pack system.

Another object of the present invention may be to provide a method of connecting electrically in series every cell to an electronically controlled switch and embedded processor to control all of the switches.

Another object of the present invention may be to provide a method for detecting a weak short by tracking which parallel group of cells self discharges the most during a long electrical rest period.

Still another object of the present invention may be to provide a methodology of detecting which cell has a weak short by tracking the amount of time each group of cells or brick of cells requires resistant voltage balancing. Those requiring the least balancing generally may have the lowest capacity and may have a cell with a weak short circuit therein.

Another object of the present invention may be to provide a battery cell for use in a battery pack that has a switch integrated directly into the cell thus reducing packaging and complexity of detecting a faulty battery cell in a battery pack system.

To achieve the foregoing objects an apparatus and method for deactivating a bad battery cell from a battery pack of cells of an energy storage system of an electric vehicle is disclosed. The apparatus includes a clam shell member arranged at the end of the cells and a printed circuit board arranged adjacent to the clam shell member. A collector plate is arranged adjacent to the printed circuit board. A switch will be arranged on the printed circuit board and a wire bond arranged between the switch and one of the cells and a second wire bond arranged between the switch and the collector plate. The system will be capable of identifying what cell has a weak short circuit therein and isolating or removing that cell from the battery pack system by opening the switch connected thereto.

One advantage of the present invention may be that it provides a novel and improved methodology and apparatus for deactivating faulty or bad battery cells from a battery pack system for use in an electric vehicle or other industrial equipment.

Still further advantage of the present invention may be that it allows for the use of a method of deactivating bad battery cells that can identify which cell has a weak short, problematic weak short or hard short circuit occurring thereon.

Another advantage of the present invention may be that it provides for an intelligent architecture capable of finding and disconnecting any cell with a weak short circuit within a battery pack system.

Another advantage to the present is that it may connect electrically in series every cell in a battery pack to an electronically controlled switch and an embedded processor for use to control all of the switches.

Still another advantage of the present invention is that it may provide a methodology of turning off one cell which is detected to have a weak short circuit by providing an open circuit when opening the switch thereon.

Another advantage on the present invention is that it may be able to track which parallel group of cells self discharges the most during a long vehicle rest period thus identifying location of the cell with a weak short circuit.

Still another advantage of the present invention may be providing a method of tracking the amount of time each brick of cells requires resistive balancing such that those requiring the least have the lowest capacity and may have a cell with a weak short circuit or problematic short circuit therein.

Furthermore, it may be an advantage of the present invention to detect which cell requires more energy than bleeder cells can provide during balancing of the battery pack voltage.

The objects, features, and advantages of the present invention will become apparent from the subsequent description and the appended claims taken in conjunction with the accompanying drawings.

DESCRIPTION OF THE EMBODIMENT(S)

Figure 1:
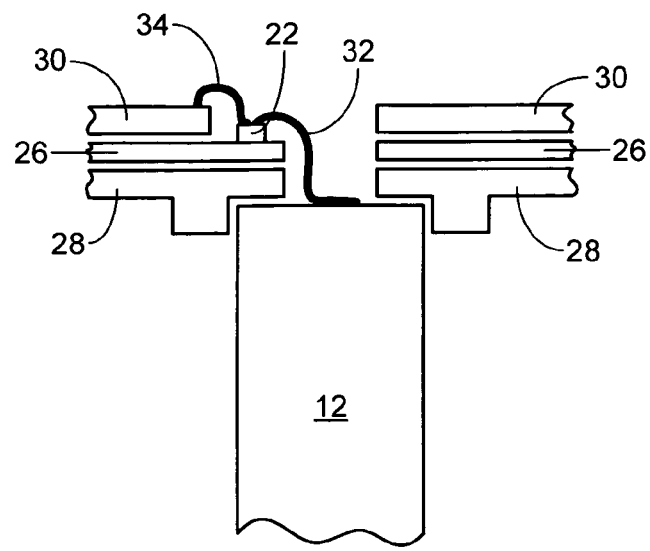
FIG. 1 shows a cross-sectional view of a portion of a battery pack utilizing the present invention.

Referring to the drawings, a method 10 and apparatus for deactivating faulty or bad battery cells from a battery pack for use in an electric vehicle or other industrial equipment is shown. It should be noted that the battery pack or energy storage system shown in the drawings is for use in an electric vehicle, however the battery pack and battery cells 12 may be used in any combination and in any design known for use in any number of industries including but not limited to any type of vehicle, or any technology dealing with aerospace, marine, aviation, industrial equipment, and any other equipment and any other electrical system that has a need for isolating or removing via deactivation faulty or bad battery cells within an electrical system.

The energy storage system or battery pack of the present invention is generally comprised of a predetermined number of battery modules or sheets, a main control and logic printed circuit board (PCB) and a twelve volt power supply. In one contemplated embodiment the energy storage system will have eleven battery modules or sheets capable of producing approximately 375 volts DC. The present invention may use any of a variety of different cell chemistries or configurations for batteries or cells 12, for example lithium ion cells using the 18650 form factor. The energy storage system in one contemplated embodiment comprises 6831 individual lithium ion cells 12 wherein these cells 12 are electrically connected in parallel groups of sixty-nine cells 12 wherein each of these groups of sixty-nine cells constitute an electric module called a brick. The bricks are then connected in series within an individual battery module in the energy storage system called sheets. Each sheet or battery module is a single mechanical assembly and consists of nine bricks electrically connected in series. Each sheet generally has a nominal voltage of approximately thirty-five volts DC. Furthermore, each of the sheets may contain a mechanical mounting system, battery monitoring hardware electronics, and a thermal management system or cooling system as well as various safety systems to ensure proper protection for the vehicle and occupants of such vehicle. Each of these sheets will be rigidly mounted within an ESS enclosure and electrically connected to one another in series. The energy storage system may also include a battery monitor board 14 that is associated with each sheet of the energy storage system and will monitor the voltage levels, temperature and other parameters of all bricks within its sheet (step 301).

Each of the cells 12 within the energy storage system (ESS) may be susceptible to a weak short circuit, a problematic weak short circuit, or a hard short circuit. A weak short circuit generally is internal to the individual cell 12. These weak short circuits may be detected during the balancing of the batteries 12 via the battery monitor board wherein the capability of balancing by the battery monitor board is reduced such that the percentage of time that each brick is balancing, when the ESS is not in use, is tracked and monitored to determine which cell 12 has the weak short (step 303). A problematic weak short may be identified via the amount of energy that a single cell requires during balancing is more energy than the bleeder bricks or cells 12 are capable of providing thereto (step 303). This will signal to the vehicle management system and associated onboard computers of the electric vehicle that the cell 12 likely has a weak short and should be removed or isolated from the battery pack. A hard short may occur when a fuse in the form of a wire bond trips or breaks during a high voltage, high current, or high temperature situation or during a vehicle crash or other unusual circumstance affecting the electric vehicle and energy storage system (step 303).

Figure 2:
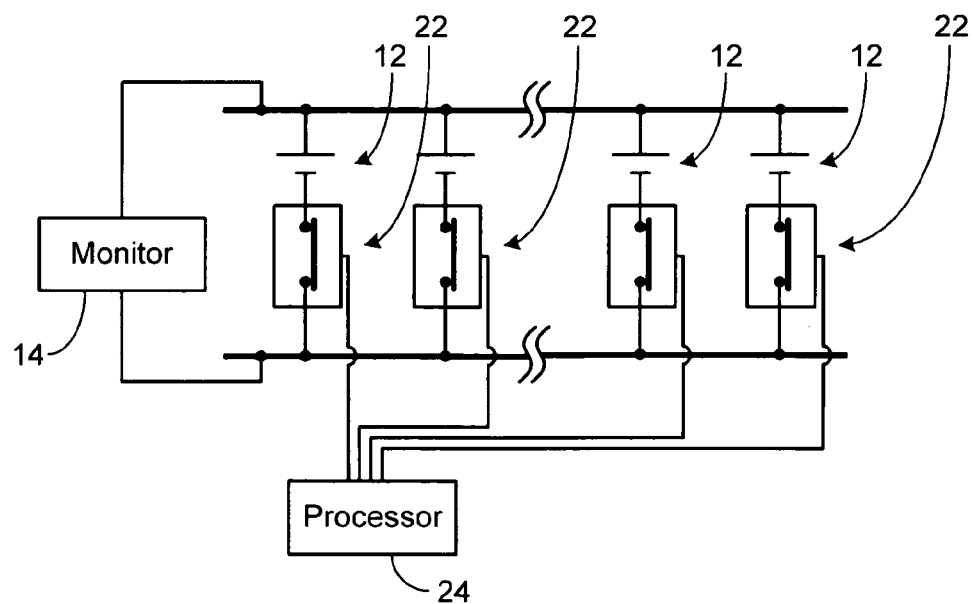
FIG. 2 shows a schematic of an apparatus for deactivating bad battery cells according to the present invention.
Figure 3:
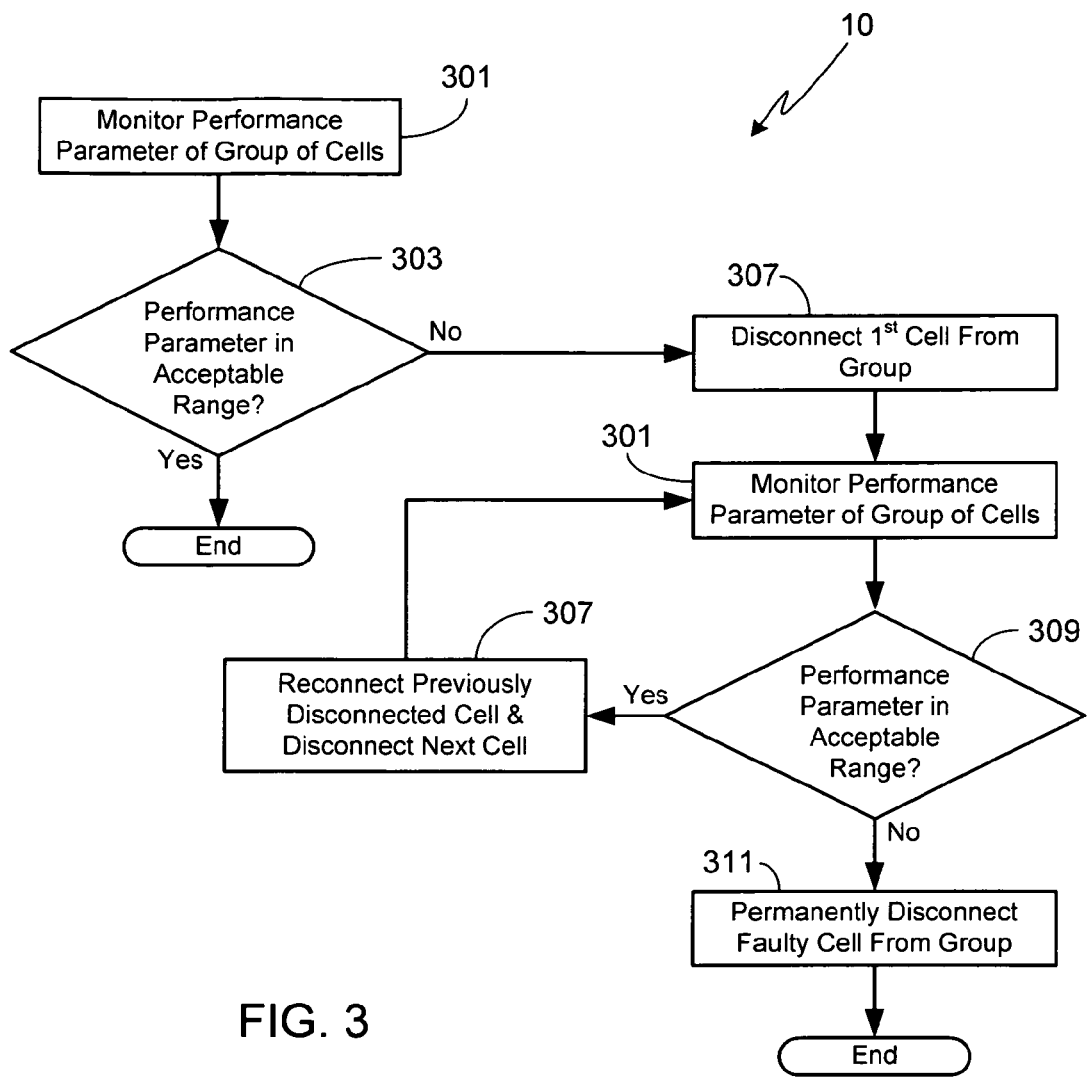
FIG. 3 shows a flow chart of one methodology of deactivating faulty or bad battery cells according to the present invention.

The methodology 10 of the present invention is capable of detecting a weak short circuit, a problematic weak short circuit and a hard short as shown in FIGS. 1 through 3. The methodology 10 in one contemplated embodiment may check a battery monitor board 14 that is attached to each sheet of the energy storage system for balancing voltage of the cells 12 such that any required voltage balancing of the cells is reported to a vehicle management system such that a weak short circuit cell 12 may be identified and either isolated or removed (step 311) from the battery pack prior to point of customer delivery or prior to putting into the electric vehicles energy storage system. Any number of methodologies (step 303) for detecting which individual cell 12 has a weak short circuit therein may be used according to the present invention.

In one contemplated methodology 10 a weak short circuit may be detected through the battery monitor board wherein the battery monitor board will track which parallel group of cells 12 self discharges the most during a long vehicle period of rest or over an aggregate of rest and drive periods (step 303). The group of cells 12 that self discharges the most during this period will allow the methodology to isolate which cell 12 has a weak short circuit and is constantly bleeding voltage from the cell 12 during non use of the electric vehicle. Another methodology contemplated to identify which cell may have a weak short circuit will track the amount of time each brick of the energy storage system requires resistive balancing (step 303). Those bricks that require the least amount of resistive balancing during the voltage balancing methodology may have the lowest capacity and hence, may have a cell 12 with a weak short circuit therein. Therefore, that brick would then be furthered examined by the methodology to identify which cell 12 has the weak short circuit within the brick. Yet another contemplated methodology will charge up low parallel bricks and track which latch or group of cells 12 has to have the most charge added thereto (step 303).

It is also contemplated that when a problematic weak short circuit does occur that a methodology 10 may reduce the likelihood of having the weak short circuit affect the overall battery pack and individual cell 12 via thermal management of the battery pack to ensure that the individual cells do not get too hot or too cold which may lead to weak short circuits occurring within the individual battery cells. Furthermore, it is also contemplated to use a charge management methodology that may ensure that none of the individual battery cells 12 of the energy storage system are over charged during charging of the battery pack. The over charging of cells may create thermal shock to the cell and lead to a weak short circuit internal to the cells cathode or anode therein. Therefore, the probing by the methodology of the present invention or a trained service technician via the use of a service manual associated with the electric vehicle of the present invention will ensure that the electric vehicle is checked for weak short circuit cells 12 prior to point of customer delivery or prior to putting the energy storage system into the electric vehicle for the consumer. If during this initial probing weak short circuits are detected the battery cell 12 may be isolated or removed from the battery pack system or the entire sheet of which the weak short circuited cell is located may be replaced prior to insertion in the vehicle or delivery to a customer.

One contemplated embodiment to detect, and isolate or remove a bad battery cell 12 from a multi cell battery pack would use an intelligent architecture of the present invention wherein that architecture is capable of finding and disconnecting any cell 12 with a weak short circuit therein. It should be noted that the present invention may be used with larger form factor cells and may provide a great advantage to such cells as the cost of the switches, printed circuit board assembly (PCB), fabrication and the like go down as the number of switches decrease within the energy storage system. It should be noted that in current battery architectures there generally is no way to disconnect a cell with a weak short circuit from the rest of a parallel group of cells without removing the module from the battery pack and physically breaking the electrical contact. This requires servicing of the electric vehicle which is inconvenient, expensive and time consuming for the manufacturer of the electric vehicle.

One method and apparatus to operate the intelligent architecture is to connect electrically in series with every cell 12 an electronically controlled switch 22 and an embedded processor 24 to control all of the switches 22. In one contemplated embodiment the electronically controlled switch 22 will be arranged on a PCB 26. The switch 22 may be in the form of a transistor, mosfet, jfet, etc. It should be noted that in another contemplated embodiment the embedded processor 24 is arranged on the PCB 26 in the form of a PIC or any other known processor. It should be noted that the embedded processor 24 may also be arranged remotely from the battery pack and arranged on the battery monitor board, vehicle management system or any other on board computer within the electric vehicle. The apparatus will form an electrical network of switches for the entire energy storage system.

As shown in FIGS. 1 through 3 a cell 12 of the energy storage system is arranged within a clamshell member 28, wherein the clamshell member 28 has a counter bore to receive and hold each of the cells 12 of the energy storage system. Arranged directly adjacent to the clamshell member 28 is a printed circuit board (PCB) 26. A collector plate 30 is then attached to a top surface of the PCB 26. Therefore, the PCB 26 will be sandwiched between a surface of the clamshell member 28 and a surface of the collector plate 30. The PCB 26 may have arranged thereon at least one switch 22 and may in one contemplated embodiment have an embedded processor or microprocessor 24 arranged thereon also. It should be noted that any methodology may be used to connect the battery cell 12 to the counter bore in the clamshell member 28, the clamshell 28 to the PCB 26 and the PCB 26 to the collector plate 30. An electrical connection 32 will then be made between the cell 12 and one side of the switch 22 on the PCB 26. A second electrical connection 34 will be made from the opposite side of the switch 22 and a surface of the collector plate 30. In one contemplated embodiment an ultrasonically bonded aluminum wire will be used to create the electrical connection 32, 34 between the collector plate 30 and the switch 22 and the switch 22 and the battery cell 12. However, it should be noted that any other methodology known or any other material may be used to create the electrical connection between the cell 12 and switch 22 and the switch 22 and collector plate 30. The apparatus may also include a PCB trace 36 arranged between the PCB 26 and the embedded processor 24 in order to control the switch 22.

It should be noted that an electric switch 22 may be connected to each and every cell 12 of the energy storage system. This will allow for each and every cell 12 to be individually removed or deactivated from the electrical system of the electric vehicle upon instructions from the embedded processor 22, the vehicle management system or any other on board computer system. It should be noted that it is also contemplated to have the switch 22 in the form of a transistor or the like and to be integrated with the cell 12 directly thus removing the need for a PCB board to be arranged within the energy storage system of the present invention.

In operation the apparatus of the present invention can be used with any of the methodologies described above or may also be used with methodologies as described hereafter. In one such contemplated methodology during normal operation of the energy storage system all of the switches 22 would be closed thus connecting all cells 12 in the battery pack to one another. This methodology would be capable of detecting if a weak short circuit is anywhere within the battery pack by having the processor 24 detect which cell 12 has the weak short circuit by switching each cell 12 off, one by one, in the entire group of the battery pack (step 307). The embedded processor 24 will monitor each of the cells 12 during this switching off to determine if the short circuit persists in the system (step 309). If the short circuit does persist the processor 24 may be able to identify exactly which cell 12 needs to be switched off for the short circuit to stop within the battery pack system (step 311). This cell 12 that is identified as having the weak short circuit will be tagged by the microprocessor 24 and the microprocessor 24 then may permanently turn off the switch 22 to the bad cell 12 thus eliminating the weak short circuit from the electrical circuit of the energy storage system.

An alternate methodology will have all of the cells 12 in a normally open position such that the off state of the energy storage system will require no power. The methodology then, when the vehicle is to be charged or driven will, via a small supplementary battery, power the processor 24 embedded in the PCB 26 to close all of the switches 22 thus connecting all of the cells 12 to one another. The electric vehicle may then be driven, charged, and the external battery could be recharged at the same time. This methodology would also use the same switching of each cell off, one by one, to detect if a weak short circuit is occurring anywhere in the battery pack (step 307). When such a cell 12 is detected and identified to have a weak short circuit, that cell 12 will be left in the off state by the microprocessor 24 thus removing, deactivating or eliminating that cell 12 and the associated weak short circuit from the battery pack system (311). It should be noted that another advantage to this methodology is that in its inert state the battery pack and energy storage system will be inherently safer because the off state requires no power to be transmitted.

Another contemplated method of detection has the PCB 26 containing a pair of traces for each cell 12. Each trace connects to a multiplexer which multiplexes these traces to a precise voltage measurement circuit. The pairs of traces extend to every cell 12 and have two additional small wirebonds to each side of the existing current carrying wirebond 32. The voltage may be measured across all the parallel cells 12 one by one in this configuration and if a weak short circuit exists, then when the pack is at rest, there may be a negative voltage drop across one wirebond which is approximately (n−1) times greater than the positive voltage drop across the other cells 12 because the surrounding cells 12 are sourcing the current which is sinking into the cell 12 with the weak short. This method may also include two traces connected to the two ends of a cells power wirebond. Once the cell 12 has been determined to be bad or faulty by measuring the voltage drop across the bond the two traces could be switched to a different circuit that would apply a current through the wirebond greater than the fusing current of the wirebond. This would fuse the wirebond and remove the cell 12 from the circuit. The traces are sized to be able to withstand the fusing current for only slightly longer than the wirebond. Each cell 12 would need its own set of traces 12. This contemplated methodology would be particularly useful in space applications and all other known applications where access to repair a pack is very difficult and cost is not a barrier, because it would enable large scale battery packs for space applications without having to substantially increase cell reliability.

It should be noted that other methodologies and apparatuses may also be used in accordance with the present invention to isolate, identify and remove bad battery cells from a multi cell battery pack. It is also contemplated that the methodology will try to prevent deep discharge of the battery via either audible or visual confirmation to the user of the vehicle. The vehicle management system may also help ensure that internal weak shorts do not occur in any of the battery cells. Therefore, any other methodology or apparatuses capable of identifying, and disconnecting a bad battery cell having either a weak short, problematic weak short, or hard short is possible to be used according to the present invention.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced otherwise than as specifically described.

What is claimed is:

1. A method of identifying and selectively disconnecting a faulty battery cell within a battery pack comprised of a plurality of cells, said method comprising the steps of:

monitoring at least one performance parameter of a group of cells within said plurality of cells;

comparing said at least one performance parameter to a range of acceptable values for said at least one performance parameter, wherein operation of said group of cells outside of said range of acceptable values indicates a short circuit within said group of cells; and determining if said group of cells is operating within said range of acceptable values and if said group of cells is operating outside of said range of acceptable values, performing the steps of:

temporarily disconnecting each cell, one by one, of said group of cells while monitoring said at least one performance parameter of said group of cells and comparing said at least one performance parameter to said range of acceptable values, wherein said step of temporarily disconnecting each cell is performed by operating a switch of a plurality of switches corresponding to the cell being temporarily disconnected, wherein each switch of said plurality of switches corresponds to each cell of said group of cells, and wherein each switch is interposed between said corresponding cell of said group of cells and a common collector element; and permanently disconnecting said faulty battery cell from the group of cells when said group of cells operates outside of said range of acceptable values during said temporary disconnecting step, wherein said permanent disconnecting step is performed by permanently operating said corresponding switch.

2. The method of claim 1 wherein said step of monitoring said at least one performance parameter of said group of cells further comprise the step of monitoring a self discharge rate for said group of cells.

3. The method of claim 1 wherein said step of monitoring said at least one performance parameter of said group of cells further comprise the step of monitoring a length of time required to perform a resistive balancing operation on said group of cells.

4. The method of claim 1 wherein said steps of monitoring said at least one performance parameter of said group of cells further comprise the step of monitoring a quantity of energy required during voltage balancing.

5. The method of claim 1 wherein operating said switch causes said switch to change between a closed state and an open state.

6. The method of claim 1 wherein operating said switch causes said switch to remain in an open state.

7. The method of claim 1 wherein said switch is a transistor.

8. An apparatus for selectively disconnecting a faulty battery cell within a battery pack comprised of a plurality of cells, said apparatus comprising:

a plurality of switches, wherein each switch of said plurality of switches corresponds to each cell of said plurality of cells, and wherein activation of a particular switch of said plurality of switches disconnects a corresponding cell of said plurality of cells from said battery pack;

a first wire bond arranged between each switch of said plurality of switches and said corresponding cell of said plurality of cells;

a second wire bond arranged between each switch of said plurality of switches and a common collector plate;

means for testing said plurality of cells to determine if a short circuit exists within said plurality of cells;

means for sequentially and temporarily disconnecting each cell of said plurality of cells by operating each switch of said plurality of switches if a short circuit is determined to exist within said plurality of cells, wherein operation of each switch of said plurality of switches causes said corresponding cell to be disconnected from said plurality of cells;

means for monitoring operation of said plurality of cells while sequentially and temporarily disconnecting each cell of said plurality of cells to identify said faulty battery cell within said plurality of cells; and means for permanently operating said switch of said plurality of switches corresponding to said faulty battery cell, wherein said faulty battery cell is permanently disconnected from said group of cells.

9. The apparatus of claim 8 wherein a processor comprises said testing means, said sequential and temporary disconnecting means, and said permanent operating means.

10. The apparatus of claim 8 further comprising a printed circuit board, wherein each switch of said plurality of switches is mounted to said printed circuit board.

11. The apparatus of claim 8 wherein operating a particular switch of said plurality of switches causes said switch to change between a closed state and an open state.

12. The apparatus of claim 8 wherein said plurality of switches are normally in an open state, and wherein operating a particular switch of said plurality of switches causes said switch to remain in an open state.

* * * * *